United States Patent
Sundstrom (10) Patent No.: US 7,613,058 B2
(45) Date of Patent: Nov. 3, 2009

(54) RADIATION HARDENING, DETECTION AND PROTECTION DESIGN METHODS AND CIRCUIT EXAMPLES THEREOF

(75) Inventor: Lance L. Sundstrom, Pinellas Park, FL (US)

(73) Assignee: Honeywell International Inc., Morristown, NJ (US)

( * ) Notice: Subject to any disclaimer, the term of this patent is extended or adjusted under 35 U.S.C. 154(b) by 551 days.

(21) Appl. No.: 11/240,882

(22) Filed: Sep. 30, 2005

(65) Prior Publication Data

US 2007/0075390 A1 Apr. 5, 2007

(51) Int. Cl.
*G11C 7/02* (2006.01)

(52) U.S. Cl. .................. 365/206; 365/214; 365/242; 365/243

(58) Field of Classification Search .......... 365/206, 365/214, 230.06, 242, 243
See application file for complete search history.

(56) References Cited

U.S. PATENT DOCUMENTS

| 4,805,148 | A  | * | 2/1989 | Diehl-Nagle et al. | 365/154 |
| 6,898,062 | B2 | * | 5/2005 | Russ et al. | 361/56 |
| 7,006,313 | B2 | * | 2/2006 | Ngo | 360/46 |
| 7,236,001 | B2 | * | 6/2007 | Fulkerson | 326/12 |

* cited by examiner

*Primary Examiner*—VanThu Nguyen
(74) *Attorney, Agent, or Firm*—Fogg & Powers LLC

(57) ABSTRACT

Radiation hardening, detection and protection design methods are disclosed. An example write drive circuit is disclosed having radiation hardened analog circuitry. A passive transistor is provided to generate a radiation photo-current to offset any net radiation photo-current of the operational circuitry. Using this technique, a radiation hardened reference-mirror control circuit provides a switched write current for setting the logical state of MRAM bits during a radiation event, for instance. A radiation detector and radiation hardened logic gates are further provided for inhibiting the write current when a radiation level is above a predetermined level.

22 Claims, 11 Drawing Sheets

Fig. 1(a)

(PRIOR ART)

Fig. 1(b)

(PRIOR ART)

RADIATION HARDENING, DETECTION AND PROTECTION DESIGN METHODS AND CIRCUIT EXAMPLES THEREOF

GOVERNMENT RIGHTS

The United States Government has acquired certain rights in this invention pursuant to Contract No. N000030-04-C-0010 awarded by the Navy.

BACKGROUND

The present invention relates generally to design methods and circuit examples of radiation hardening and more particularly to design methods and circuit examples that minimize, eliminate and/or utilize the effects of radiation dose rate induced photo-currents in electronic circuit functions.

Radiation can generate hole-electron pairs in the junction of a transistor, which results in a photo-current through the junction. The magnitude of the photo-current depends upon the radiation dose rate level, and the collection volume (e.g., transistor junction size) and may be independent of the gate-controlled current. The photo-current can be analogized to a radiation-controlled current source that persists even when the junction voltage approaches zero volts (0V). Radiation dose rate is measured as the equivalent radiation absorbed dose (Rad) in silicon (Si) per second and is expressed as Rad(Si)/s. In a radiation dose rate environment, the total current through a transistor is the sum of its gate-controlled current and its radiation dose rate induced photo-current. Photo-currents can shift and/or upset the function of an analog or digital circuit. An analog circuit is typically more susceptible than a digital circuit because its transistors are operated in their linear region and its circuit impedance is relatively high. A digital circuit is less susceptible than an analog circuit because its transistors are either off or saturated and its circuit impedance is relatively low. Even so, photo-currents can reduce the output drive strength (fan out) and slow down the timing of digital circuits.

Radiation hardening refers to design methods for reducing electronic circuit susceptibility to radiation and/or inhibiting circuit function. Special design methods and examples are presented herein for making analog and digital circuit functions either independent (i.e. immune) or dependent of radiation dose rate induced photo-currents.

In magnetoresistive random access memory (MRAM), data is stored by using an electric current to create a magnetic field for switching a magnetic direction of a ferromagnetic layer of a multilayer memory element (also known as a bit). An MRAM is described as a type of nonvolatile (NV) memory because a logical state of a memory element will persist even when power is removed from the memory device. Although there are other types of nonvolatile memory chips, MRAM allows rapid read and write sequences. And unlike dynamic random access memory (DRAM), MRAM does not require a constant flow of current to retain its data—thus consuming less power.

MRAM has historically been arranged in a two-dimensional (2D) array of MRAM bits with write line trace currents associated with each row and column of the array. A typical MRAM bit is structured as a multilayer element having two magnetic (ferromagnetic) layers separated by a spacer layer. A logical state of the MRAM bit may be determined by the relative orientation of the magnetization directions of the magnetic layers. Writing the logical state of the MRAM bit involves setting the relative orientations—this is typically done by applying an external magnetic field to the bit.

An MRAM typically uses controlled write current pulses to switch a magnetic bit between its low and high magnetoresistive states. When using a two-dimensional (2D) bit selection scheme, each of orthogonal X and Y trace currents must each be below the magnetic bit switching threshold, while the combined X and Y trace currents at their intersection (the selected bit location) must be above the magnetic bit switching threshold.

Thus, there are stringent requirements on the uniformity of MRAM bit switching thresholds across an MRAM array and on pulse current pulse magnitudes to ensure that half-selected bits do not write (switch logical state) while ensuring that fully-selected bits do write.

A typical MRAM requirement for military and space applications allows no bad writes below the radiation dose rate upset (DRU) level and only one bad write to a known address between the DRU and radiation dose rate survivability (DRS) levels. Since standard address inputs and latches are not reliable above the DRU level, the write operation must be inhibited above the DRU level.

Figure 1A:
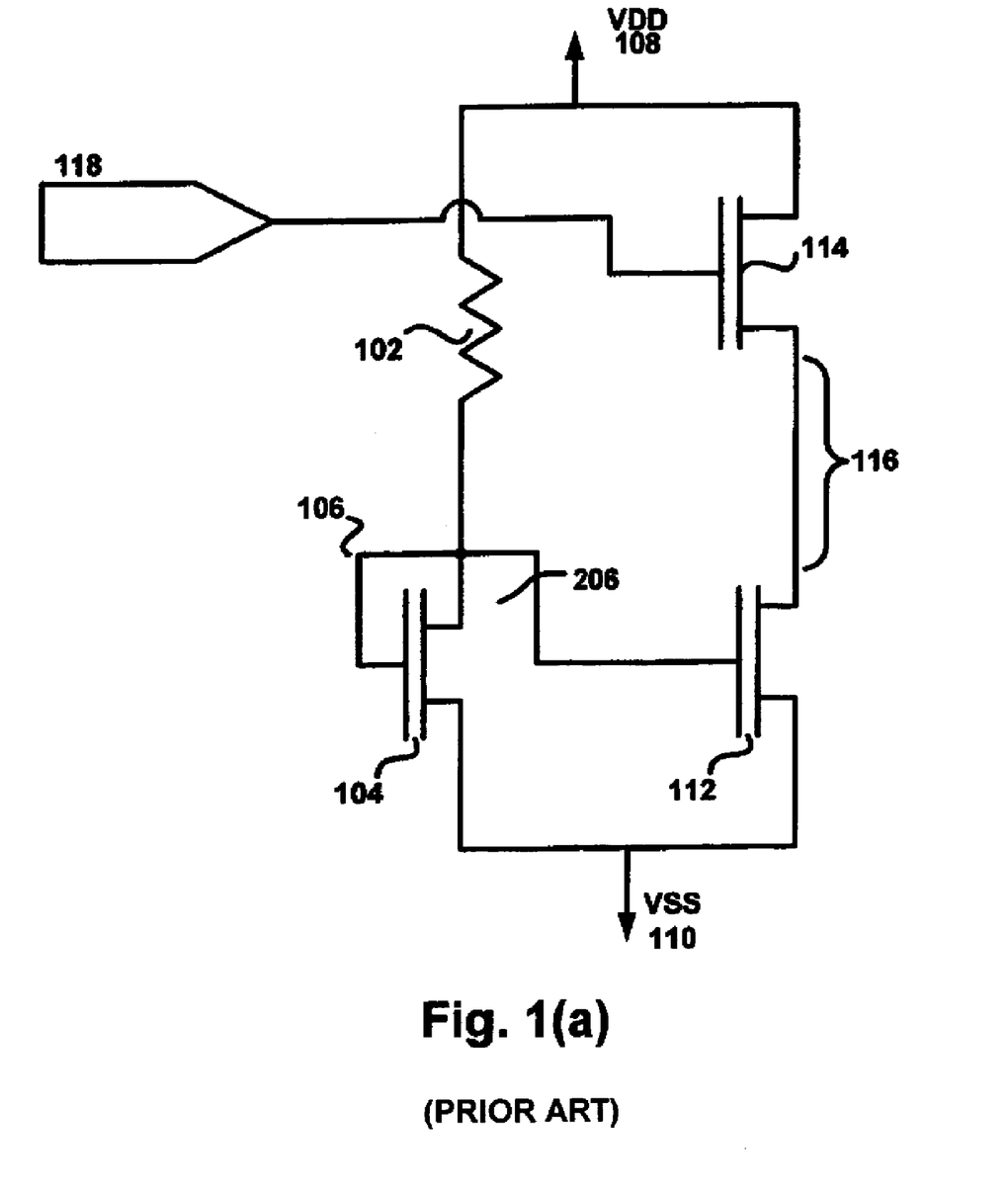

FIG. 1(a) depicts an example simple analog current reference and switched current driver schematic. A reference current and voltage is established by series-connecting a resistor 102 and a diode-connected (gate coupled to drain) n-channel reference transistor 104 between the power rail (VDD) 108 and the ground rail (VSS) 110. The gate-drain of n-channel reference transistor 104 is connected to the gate of a second n-channel transistor 112 to configure the second n-channel transistor 112 as a current mirror. The voltage level of the gates of the two n-channel transistors 104, 112 is the reference voltage on circuit node 106. A p-channel transistor 114 is connected as a current switch between the drain of the n-channel current mirror transistor 112 and the power rail 108. A write select input 118 is connected to the gate of the p-channel current switch transistor 114 and serves as a switching input. The trace connecting the current mirror transistor 112 and the p-channel current switch transistor 114 is the write line trace 116.

When the write select 118 is high (inactive), the p-channel current switch transistor 114 is off and no current flows through the write line trace 116. When the write select 118 is low (active), the p-channel current switch transistor 114 is on and the current mirror transistor 112 mirrors the reference current in the resistor 102 and the n-channel reference transistor 104. The ration of the current in the write line trace 116 to the reference current is a function of the ration of mirror to reference transistor sizes—i.e., a function of the ratio of the size of the n-channel current mirror transistor 112 to the n-channel reference transistor 104.

Figure 1B:
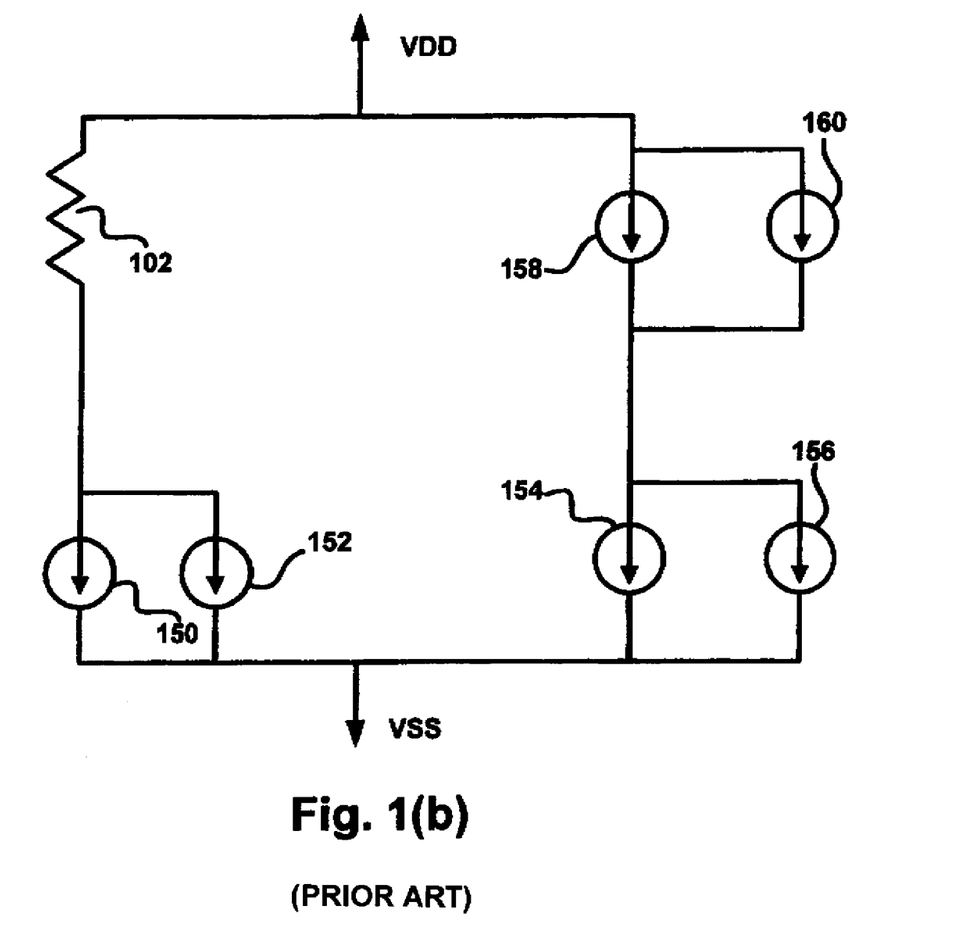

FIG. 1(b) depicts transistor gate-currents and radiation photo-currents of the circuit of FIG. 1(a). The reference current is the sum of the n-channel reference transistor 104 gate-current 150 and radiation photo-current 152. As this current sum increases, the voltage across the resistor 102 increases and the reference voltage developed across the n-channel reference transistor 104 decreases. This in turn causes a shift in the current mirrored by the n-channel current mirror transistor 112.

With the write select input 118 high (inactive), the p-channel current switch transistor 114 is off and the write line trace 116 current becomes the smaller of the p-channel current switch transistor 114 radiation photo-current 160 and the sum of the n-channel current mirror transistor 112 gate current 154 and radiation photo-current 156. In this case, increasing radiation levels can lead to a false write even if the write select input is high (inactive).

With the write select input 118 low (active), the p-channel current switch transistor 114 is on and the write line trace 116 current becomes the smaller of the sum of the p-channel current switch transistor 114 gate current 158 and radiation photo-current 160 and the sum of the n-channel current mirror transistor 112 gate current 154 and radiation photo-current 156. In this case, increasing radiation levels lead to higher reference and write line trace 116 current magnitudes, which can in turn cause a false write to half-selected bits.

Even below the radiation dose rate upset (DRU) level, the radiation photo-currents can shift both the reference and write line trace 116 current magnitudes and upset the drive states of circuits of FIG. 1(*a*).

SUMMARY

Disclosed are methods and circuit examples for reducing, eliminating and/or utilizing the effects of radiation dose rate induced photo-currents in analog or digital circuit functions.

Disclosed is an apparatus for offsetting or canceling radiation photo-currents that may disturb write trace current magnitudes even below a radiation dose rate upset (DRU) level and an associated apparatus for inhibiting write currents when operating above the DRU level.

Each operational transistor or set of transistors in an operational circuit may be associated with a passive transistor, preferably co-located and of the same type, that is configured to provide a radiation dose rate photo-current to substantially offset a radiation dose rate photo-current generated by the operational transistor(s).

In a control circuit for an MRAM array write line trace, a current mirror transistor has a reference voltage applied to its gate, a first portion of a write line trace coupled to its drain, and a ground rail coupled to its source. A passive transistor (preferably co-located and of the same type with its gate coupled to its source) has its source coupled to the drain of a current mirror transistor and its gate and drain coupled to a power rail so that the radiation dose rate photo-current of the current mirror transistor is substantially offset by the radiation dose rate photo-current of this passive transistor.

A radiation hardened write switch apparatus may take a similar form with a write select rather than the reference voltage line. Alternatively, the switch apparatus may operate through a radiation hardened NAND gate that includes a plurality of operational transistors forming a NAND logic circuit and a passive n-channel transistor coupled to an output of the NAND gate and to VSS such that a radiation photo-current of the passive n-channel transistor substantially offsets any composite radiation dose rate photo-current developed by the operational elements of the NAND gate logic circuit.

An inverting buffer gate may similarly include a pair of operational transistors (n-channel and p-channel) forming the logic circuitry and a passive n-channel transistor coupled to the logic circuitry to offset any composite radiation dose rate photo-current developed by the operational elements of the circuit. The relative n-channel and p-channel operational transistor gate widths are sized for balance low and high output drive strengths and the passive transistor is sized to offset any unbalanced radiation dose rate photo-current developed by the operational elements.

Because address inputs are not reliable above the radiation dose rate upset (DRU) level, the write operation may be inhibited above the DRU level. In an embodiment, write inhibition operates through a fixed active-low radiation dose rate detector scheme passing through the radiation hardened inverting buffer and NAND gates.

BRIEF DESCRIPTION OF THE DRAWINGS

FIG. 1(*a*) is a schematic of a circuit having a simple reference current and switched current mirror driver.

FIG. 1(*b*) is a schematic depicting gate-currents and radiation dose rate photo-currents of transistors of the circuit in FIG. 1(*a*).

FIG. 2(*a*) is a schematic of a circuit having a simple reference current, a switched current mirror driver and passive transistors for radiation dose rate immunity.

FIG. 2(*b*) is a schematic depicting gate-currents and radiation dose rate photo-currents of transistors of the circuit in FIG. 2(*a*).

DETAILED DESCRIPTION OF THE DRAWINGS

Figure 2A:
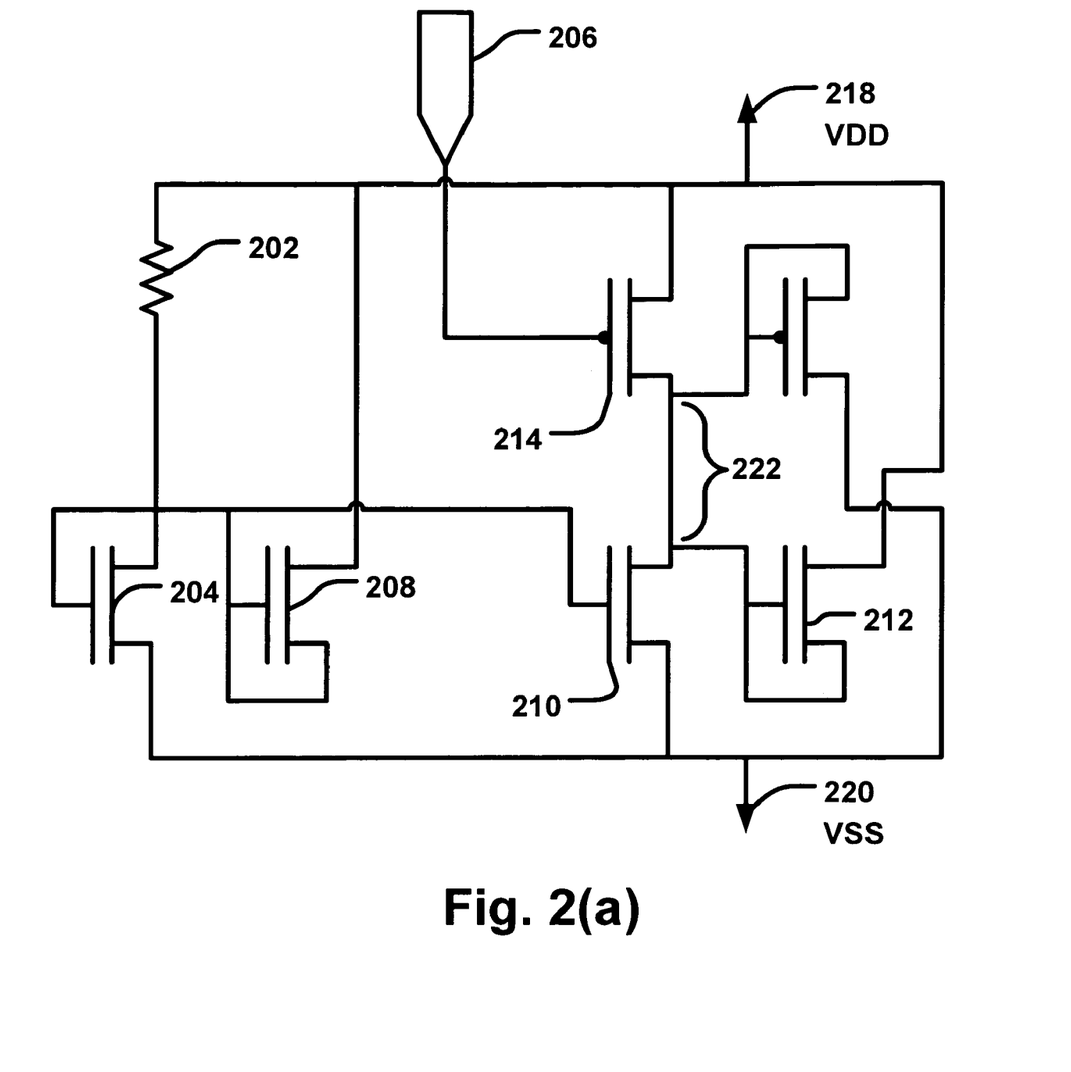

Disclosed is a radiation hardened write current driver operating with a current reference. FIG. 2(*a*) depicts an embodiment of a radiation hardened circuit having a simple current reference and switched current driver. A write line trace 222 is arranged such that a current passing through the write line trace 222 creates a magnetic field acting on a plurality of MRAM bits (not shown). In many MRAM applications, it is important to closely control parameters of the applied magnetic field in order to avoid the creation of artifacts, such false writes. In a radiative dose rate environment, individual transistors may operate as current sources, regardless of the gate voltage. The ensuing radiation dose rate photo-current can potentially disrupt MRAM write operations and leave artifacts. This result is not tolerated for many applications, such military and space applications.

A first transistor 204 has its source coupled to a ground rail or VSS 220, and its gate and drain coupled to a reference voltage circuit node 224. A resistor 202 is an electronic component that impedes the flow of current and may come in a variety of forms. The resistor 202 is intercoupled between the reference voltage circuit node 224 and a power rail or VDD 218. The arrangement of the first transistor 204 in series with the resistor 202 forms a simple reference circuit that may be used to maintain a reference current. In a preferred embodiment, the first transistor 204 is an n-channel transistor and may also be known as a reference current transistor.

A second transistor 208 has its source coupled to the reference voltage point 224 such that a radiation dose rate photo-current in the first transistor 204 is substantially offset by a radiation dose rate photo-current of the second transistor 208. In order to more exactly generate an offset radiation dose rate photo-current, the second transistor 208 may be co-located with the first transistor 204 and of the same type. Co-location allows both transistors to experience the same radiation levels. Further the two transistors may be of the same type and same size so that they will have the same response to a given radiation level. The drain of the second transistor 208 may be coupled with VDD 218. Further, the second transistor 208 may be "tied-off" (passive) in that its gate is coupled to its source. The second transistor 208 may also be considered part of the reference circuitry.

A third transistor 210 has its source coupled to VSS 220 and its drain coupled to a first portion of the write line trace 222. The third transistor 210 has its gate coupled to the reference voltage circuit node 224. In a preferred embodiment, the third transistor 210 is an n-channel transistor. The third transistor 210 may also serve as a current mirror transistor in relation to the reference current transistor 204.

A fourth transistor 212 has a source, a drain, and a gate. The source of the fourth transistor 212 is coupled to the first portion of the write line trace 222 such that a radiation dose rate photo-current in the third transistor 210 is substantially offset by a radiation dose rate photo-current of the fourth transistor 212. In order to more exactly generate an offset radiation dose rate photo-current, the fourth transistor 212 may be co-located with the third transistor 210. Further, the two transistors 210 & 212 may be of the same type and same size. The drain of the fourth transistor 212 may be coupled to VDD 218. Further, the gate of the fourth transistor 212 may be coupled to its source to make it passive.

A fifth transistor 214 has its gate coupled to a write select input 206 that provides an input for turning the write line trace 222 current on and off. The drain of the fifth transistor 214 may be coupled to a second portion of the write line trace 222 and its source coupled to VDD 218. In a preferred embodiment, the fifth transistor 214 is a p-channel transistor and may be known as a write select transistor or, more generally, a write switch apparatus.

A sixth transistor 216 has a source, a drain, and a gate. The source of the sixth transistor 216 is coupled to the second portion of the write line trace 222 such that a radiation dose rate photo-current in the fifth transistor 214 is substantially offset by a radiation dose rate photo-current of the sixth transistor 216. In order to more exactly generate an offset radiation dose rate photo-current, the sixth transistor 216 may be co-located with the fifth transistor 214. Further, the two transistors, 214 & 216, may be of the same type and same size. The drain of the sixth transistor 216 may be coupled to VSS 220. Further, the gate of the sixth transistor 216 may be coupled to its source to make it passive.

The first, third and fifth transistors, 204, 210 & 214 form the operational core of the write reference and control circuitry configured to regulate the current passing through the write line trace 222. As explained, the second, fourth and sixth transistors 208, 212 & 216 serve to substantially offset any radiation dose rate photo-current in the first, third and fifth transistors 204, 210 & 214 respectively. The third through sixth transistors may also form a switched current mirror circuit coupled between VDD 218 and VSS 220 and be arranged in parallel with the reference circuit defined above.

The addition of the matching passive transistors (second 208, fourth 212, sixth 216) operates to help ensure proper operation of the reference current and switched write current driver at radiation dose rate levels below the radiation dose rate upset (DRU) level. At radiation levels above the radiation DRU level, however, there may still be an upset on the write select input 206 and other areas. The circuit of FIG. 2(a) relies on radiation dose rate photo-current matching for radiation dose rate photo-current cancellation. A more aggressive approach would be to remove bias from all but the selected write current drivers and to inhibit all write currents above the radiation DRU level.

According to an embodiment, the n-channel and p-channel transistor are field effect transistors (FETs) in which the channel (region separating the source and drain) is made of an n-type or p-type semiconductor respectively. A Field Effect Transistor is a solid-state device in which current is controlled between source and drain terminals by voltage applied to a non-conducting (e.g., insulated) gate terminal (in contrast, bipolar transistors are current-controlled). A more functional definition of a FET is as a transistor in which output current is controlled by a variable electric field. Either definition may be appropriate for the various embodiments. Alternatively, the transistor may be a uni-junction transistor (UJT) in which the substrate is made of n-type or p-type semiconductor. Of course, one skilled in the art may recognize that other embodiments of the transistor are available.

Figure 2B:
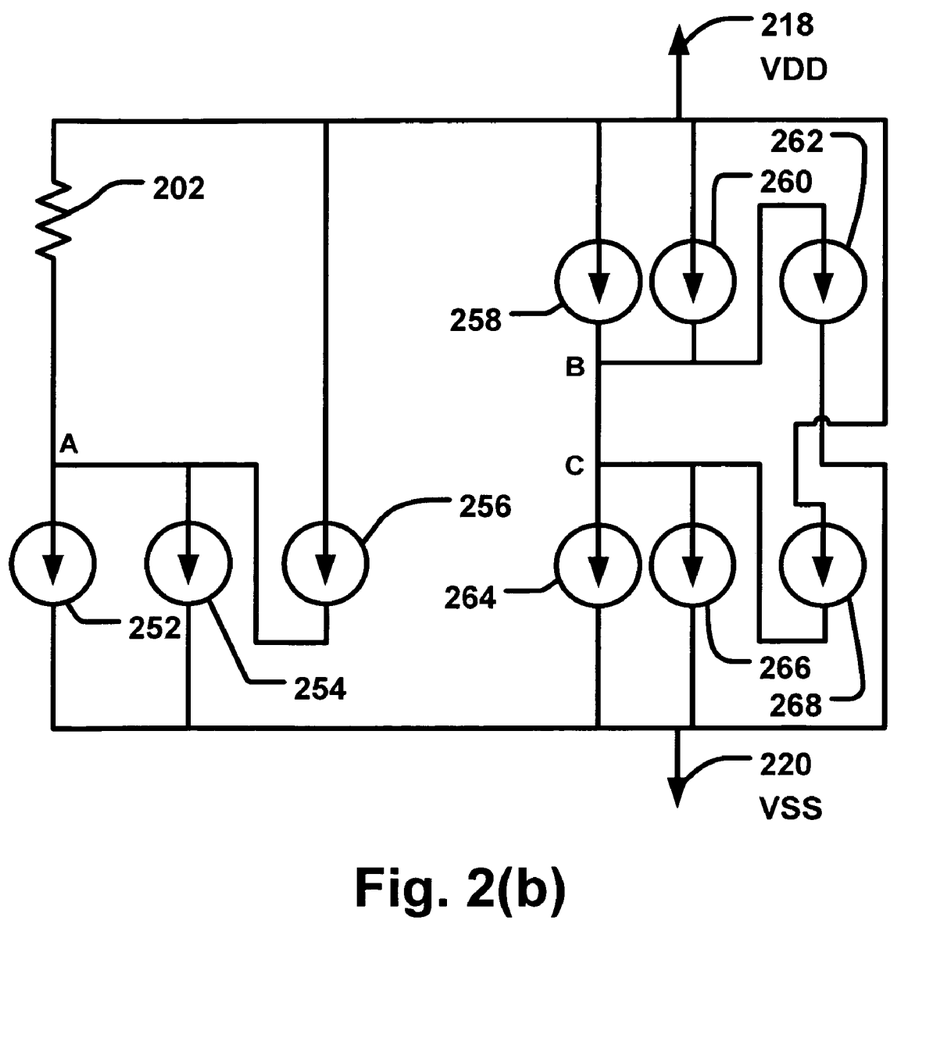

FIG. 2(b) depicts gate-currents and radiation photo-currents of the transistors and is useful for showing how the matching passive transistors may provide the offsetting radiation photo-current. At the first transistor 204, a first gate-current 252 and first photo-current 254 provide pull-down current at point A, a second photo-current 256 generated by the second transistor 208 provides a pull-up current at point A. If the first and second photo-currents are properly matched then they will offset (e.g., cancel each other)—leaving only the first gate current 252.

At the third transistor 210, a third gate current 264 and third photo-current 266 provide pull-down current at point C, a fourth photo-current 268 generated by the fourth transistor 212 provides a pull-up current at point C to offset the third photo-current 266. At the fifth transistor 214, a fifth gate-current 258 and fifth photo-current 260 provide a pull-up current at point B. A sixth photo-current 262 generated by the sixth transistor 216 provides a pull down current at point B to offset the fifth photo-current 260.

Figure 3:
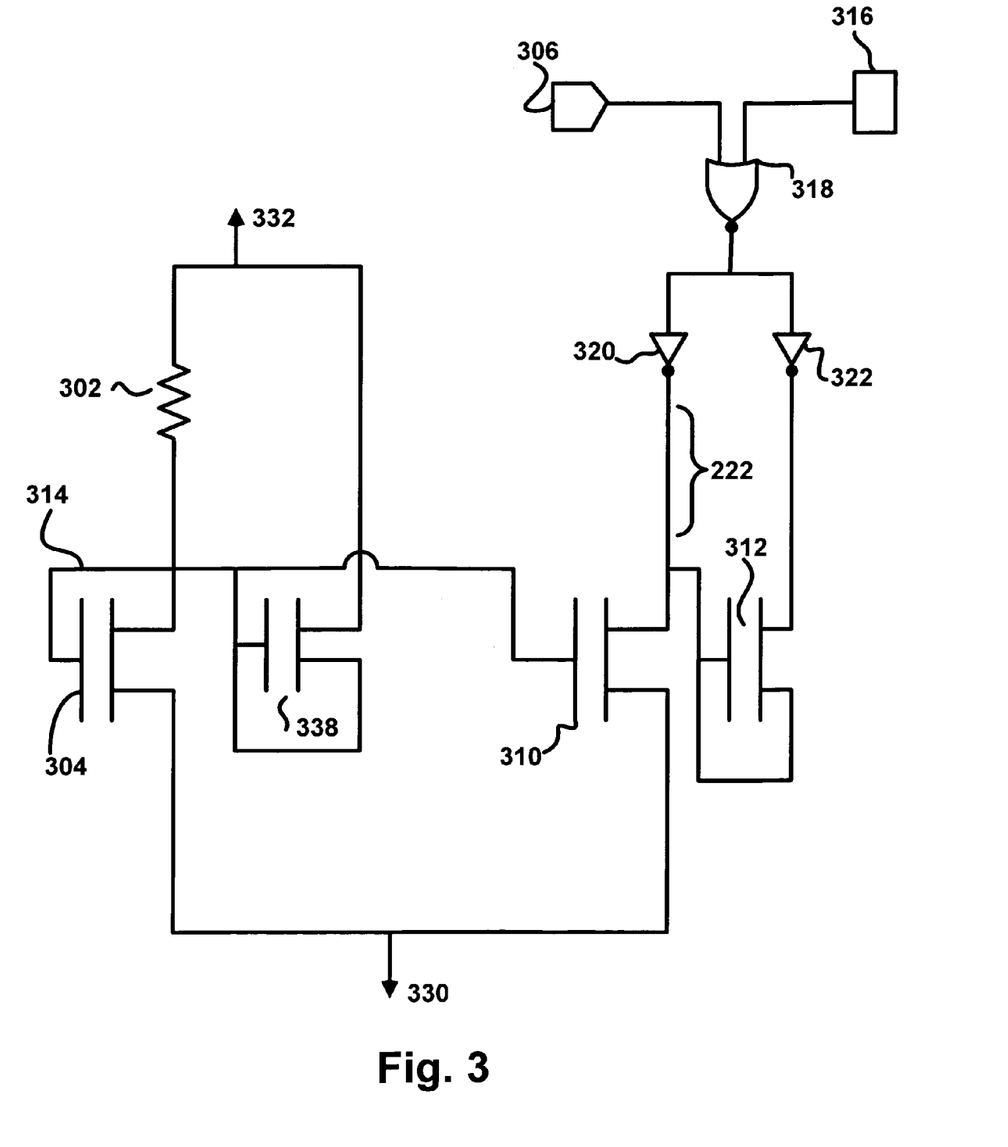
FIG. 3 is a schematic of a circuit having a simple reference current, a switched current mirror driver, radiation dose rate immunity, detection and active write protection.

FIG. 3 depicts a radiation hardened switched write circuit having an inhibition mechanism for inhibiting write currents from being applied at radiation dose rate levels above the radiation dose rate upset (DRU) level.

A write line trace 222 is arranged such that a current passing through the write line trace 222 creates a magnetic field acting on a plurality of MRAM bits (not shown). A first transistor 304 has its source coupled to VSS 330 and its gate and drain coupled to a reference voltage circuit node 314. A resistor 302 is an electronic component that impedes the flow of current may come in a variety of forms. The resistor 302 is intercoupled between the reference voltage circuit node 314 and VDD 332. At a second transistor 308 has its gate and source coupled to the reference voltage point 314 and its drain coupled to VDD 332 to provide an offset radiation dose rate photo-current. A third transistor 310 has its source coupled to VSS 330 and its drain coupled to a first portion of the write line trace 222. The third transistor 310 has its gate coupled to the reference voltage circuit node 314. At a fourth transistor 312 has its gate and source coupled to the first portion of the write line trace 222 and its drain is coupled to an output of a second inverting buffer 322.

In FIG. 3, the fourth and fifth transistors 214, 216 of FIG. 2(a) are replaced by a radiation hardened NAND gate 318 having as inputs an active low write select 306 and a fixed (or programmable) active low radiation detector 316. The NAND gate 318 outputs to inputs of a first and a second inverting buffer gate 320, 322.

The first inverting buffer gate 320 is arranged having an output coupled to a second end of the write line trace 222 and may drive the current at that end. The output of a second inverting buffer gate 322 is coupled to a drain of the fourth transistor 312 and drives a pull-up radiation dose rate photocurrent that offsets or cancels the pull-down radiation dose rate photo-current of the third transistor 310.

One radiation hardening design method for digital circuits would be to size the existing active pull-up and pull-down transistors for balanced radiation dose rate pull-up and pull-down photo-currents instead of for balanced active low and high output drive strengths. In the case of the example CMOS inverting buffer of FIG. 8, this would change the active high/low output drive strength ratio to about ½. In the case of the example CMOS NAND gate of FIG. 9, its active high/low output drive strength ratio would be reduced to about ¼. This is undesirable because it causes data or logic state dependent gate delays and output drive strengths (fan out). Rather, the preferred radiation hardening design method for digital circuits is to size the active pull-up and pull-down transistors for balanced active high/low output drive strengths and add passive transistors (e.g. gate tied to source or base tied to emitter), as needed, to balance the radiation dose rate induced pull-up and pull-down photo-currents at critical circuit nodes.

Another method of radiation hardening is to provide radiation detection, which in turn is used as a control signal to inhibit or disable functions and/or circuits that are susceptible to radiation. A nuclear event detector (NED) provides an indication when a nuclear event has occurred. It's usually a discrete device located somewhere in the system. It can provide an output signal to indicate that the radiation has exceeded its trip level (typically lower the radiation DRU level of the electronics). A NED is useful for recovery and sometimes for circumvention. In some environments, however, the radiation can exceed the DRU level before the NED can generate and deliver a signal to the circuits to be inhibited or disabled.

On-chip radiation dose rate detection circuits are proposed for providing a local early warning signal of a radiation event before it reaches the DRU level of the local electronics and thereby improve circumvention and recovery.

If the radiation detector 316 is below its trip level, its output is high (inactive). If the radiation is above the trip level, the output of the radiation detector 316 is low (active) and continues to remain low up to a radiation survivability level. Typically, the trip level may be designed to be less than or equal to the radiation dose rate upset (DRU) level.

Figure 4:
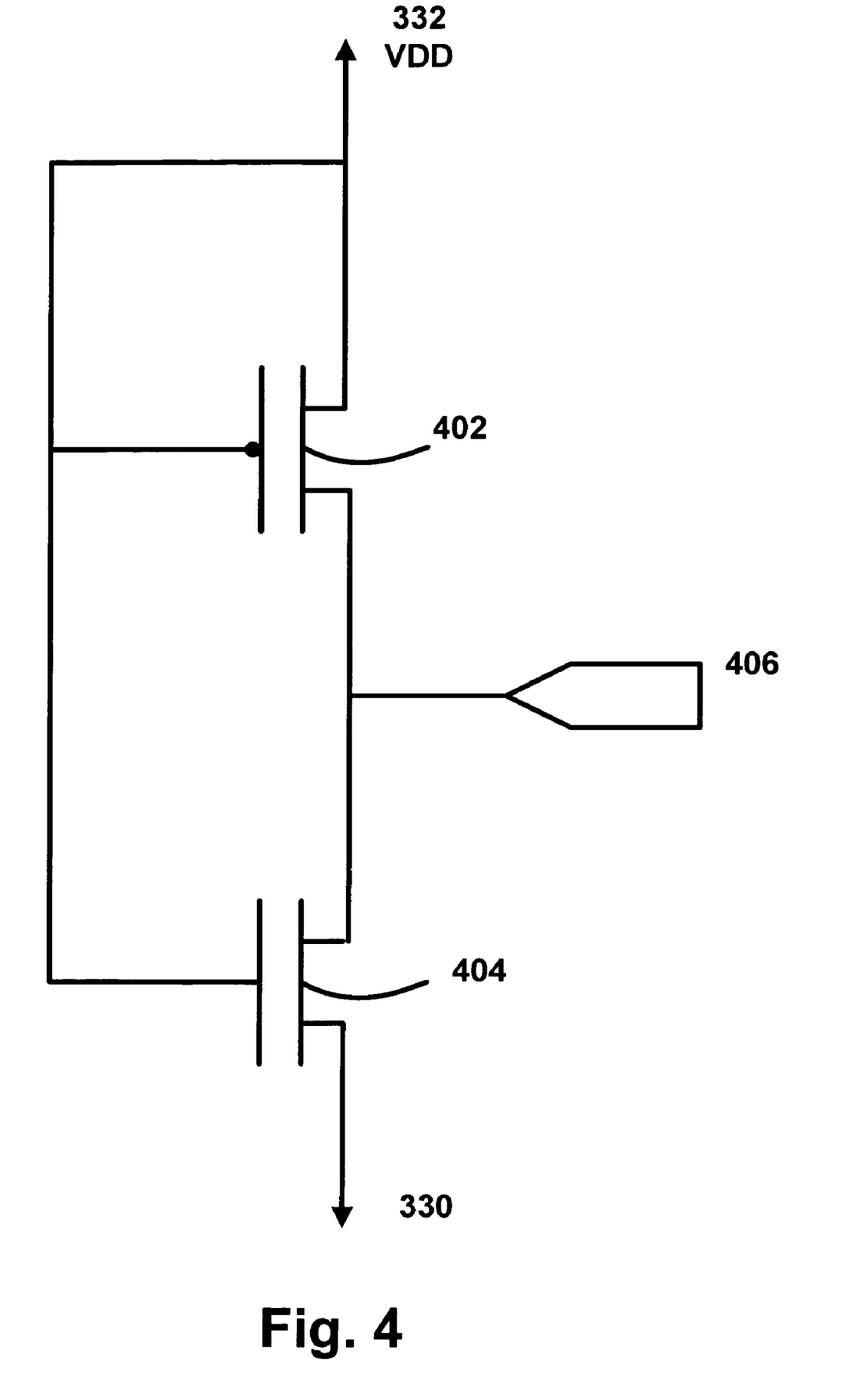
FIG. 4 is a schematic of a fixed active-high radiation dose rate detector circuit.

FIG. 4 depicts a schematic of a fixed CMOS radiation detector with active high output. A drain of a first p-channel transistor 402 is coupled with a drain of a first n-channel transistor 404 and with an output 406. A source of the first p-channel transistor 402 is coupled with VDD 332 and with a gate of both the first p-channel transistor 402 and the first n-channel transistor 404. A source of the first n-channel transistor 404 is coupled with VSS 330.

The radiation detector is configured to provide an output signal to indicate that radiation has exceeded a trip level. In the configuration of FIG. 4, the radiation circuit appears similar to an inverting buffer logic gate with its input tied high (VDD) and its output normally low. In this configuration, the first p-channel transistor 402 is off and the first n-channel transistor 404 is on. In a radiation environment, the first p-channel transistor 402 has only radiation photo-current while the first n-channel transistor 404 has both gate current and radiation photo-current. The first p-channel transistor 402 is sized to generate a much larger radiation photo-current than the first n-channel transistor 404. Part of the radiation photo-current of the first p-channel transistor 402 is offset or cancelled by the radiation photo-current of the first n-channel transistor 404. The remaining difference radiation photo-current behaves like a radiation-controlled pull-up current source that opposes the gate current of the first n-channel transistor 404. The two transistors may be sized such that the difference radiation photo-current overcomes the gate current of the first n-channel transistor 404 at a desired radiation level, such as the trip level. At this radiation level, the output switches from low to high and provides an indication that this radiation level has been reached or exceeded. The first p-channel transistor 402 could be replaced by a resistor.

Figure 5:
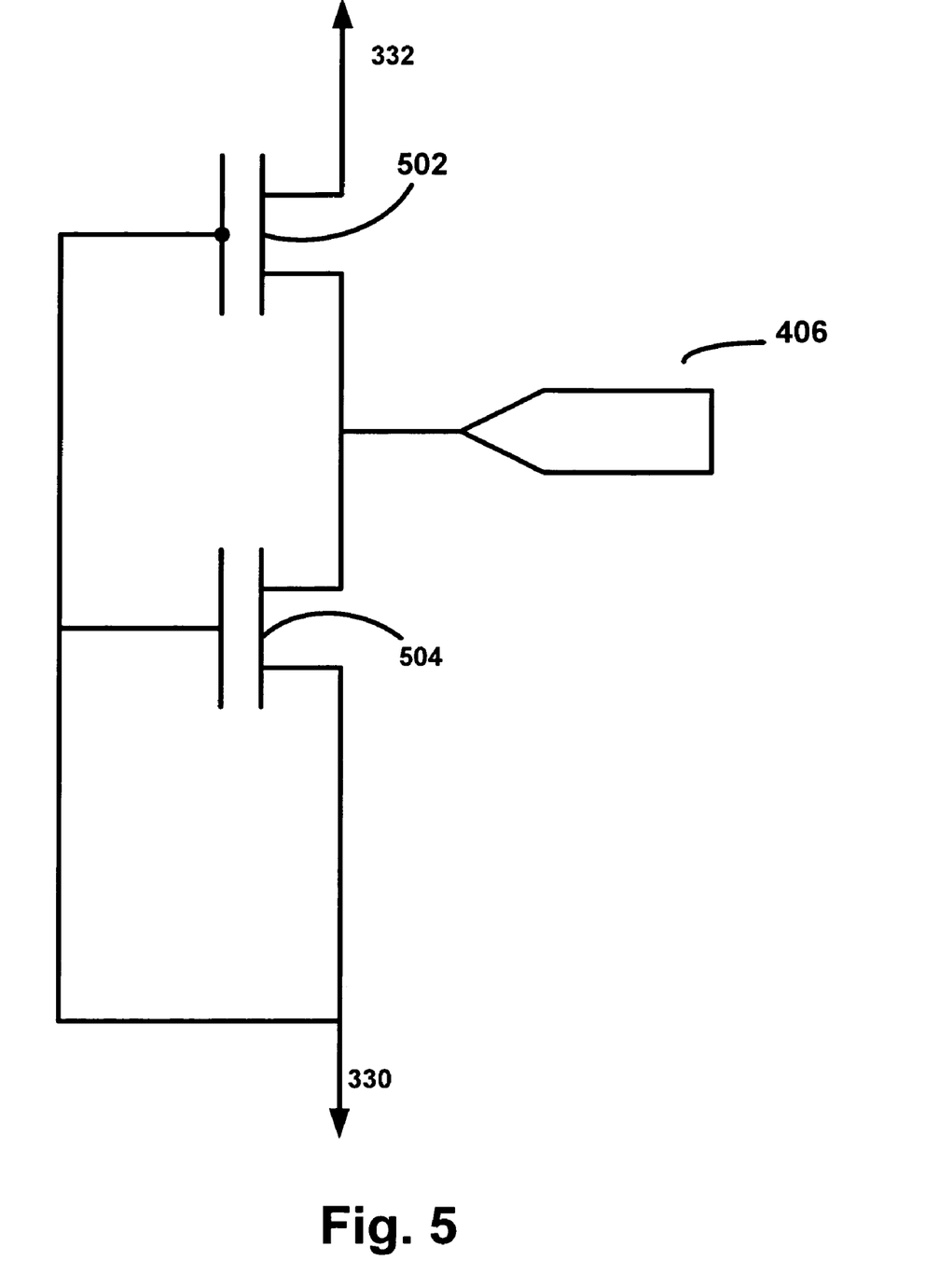
FIG. 5 is a schematic of a fixed active-low radiation dose rate detector circuit.

FIG. 5 depicts an embodiment of a fixed complementary metal oxide semiconductor (CMOS) radiation detector with an active low output. In this configuration, the gates of both transistors 502, 504 are tied to VSS 330, the drains tied to the output 406, the source of the p-channel transistor 502 to VDD 332, and the source of the n-channel transistor 504 is tied to VSS 330. In this case, the n-channel transistor 504 should be sized such that at the trip radiation level, the radiation photo-current of the n-channel transistor 504 overcomes the gate current and photo-current of the p-channel transistor 502. The first n-channel transistor 504 could be replaced with a resistor.

Figure 6:
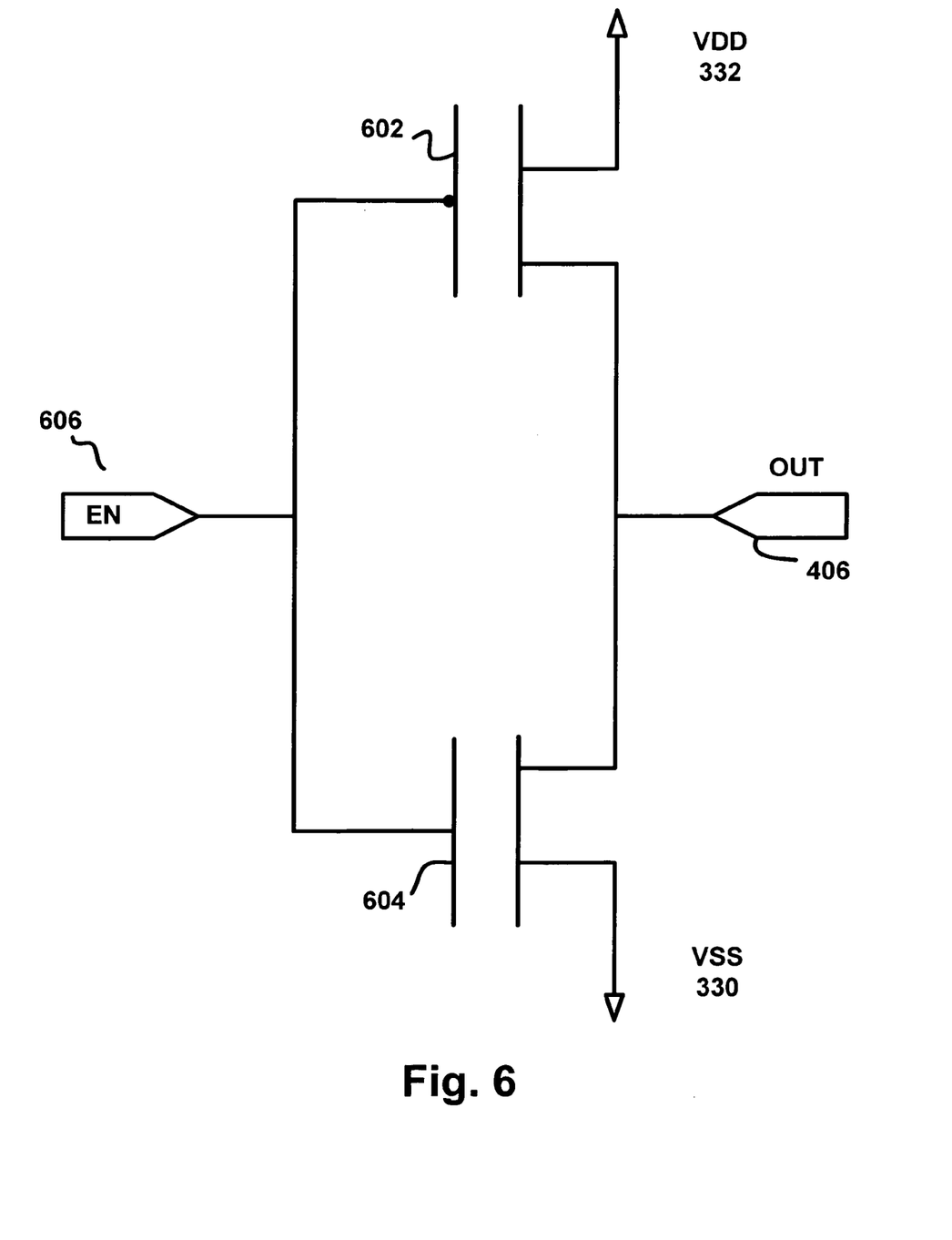
FIG. 6 is a schematic of a radiation dose rate detector with enable.

FIG. 6 depicts an embodiment of a fixed COMS radiation detector with an active high/low output and an enable input. The radiation detector operates much like an inverting buffer logic gate but has different characteristics depending upon the relative sizes of its p-channel pull-up and n-channel pull-down transistors 602, 604.

When the p-channel pull-up 602 is sized for a larger radiation photo-current than the n-channel pull-down 604, the detector has the following two modes of operation. With its enable input 606 high, the detector behaves like a fixed CMOS radiation detector with an active high output as depicted in FIG. 4. With its enable input 606 low, the radiation detector has a high output. Thus, the output goes high if the radiation exceeds the radiation trip level or if its enable input 606 goes low.

When the n-channel pull-down 604 is sized for a larger radiation photo-current than the p-channel pull-up 602, the detector has the following two modes of operation: with its enable input 606 low, the detector behaves like a fixed CMOS radiation detector with an active low output as depicted in FIG. 5. With its enable output 606 high, the radiation detector has a low output. Thus, the output goes low if the radiation exceeds the radiation trip level or if its enable input 606 goes high.

Figure 7:
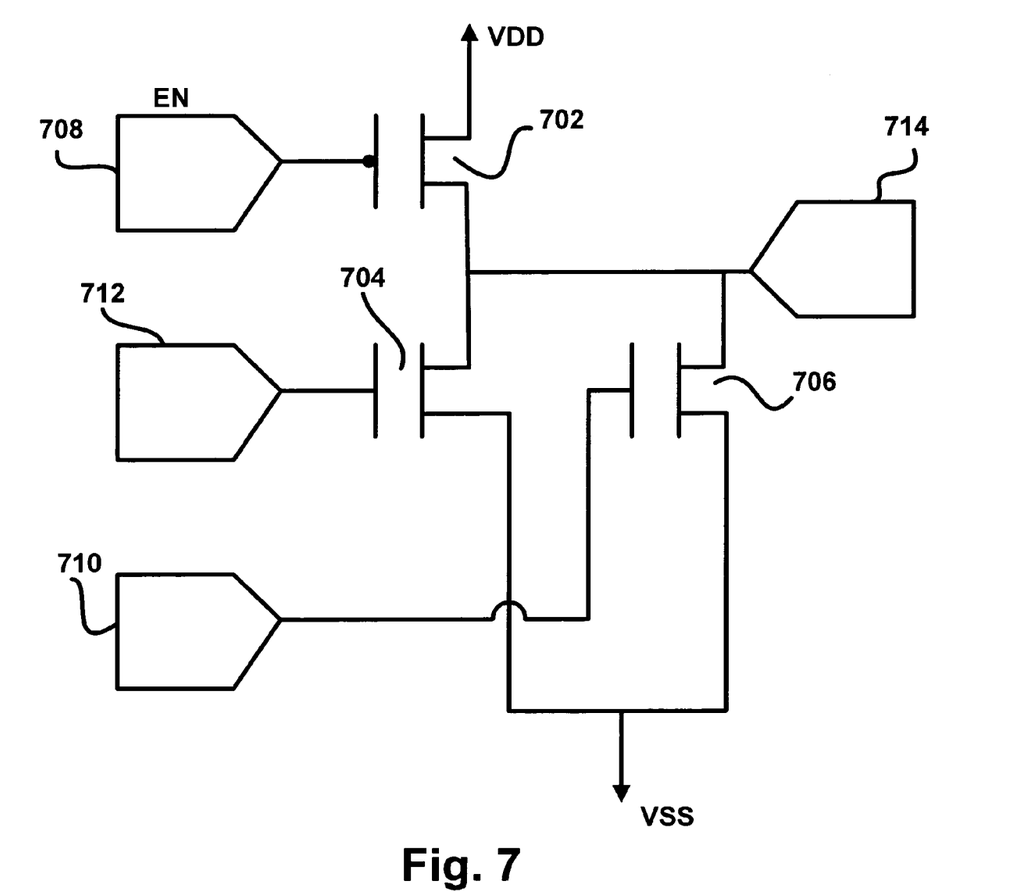
FIG. 7 is a schematic of a programmable active-high radiation dose rate detector with enable.

FIG. 7 depicts an example of a programmable radiation detector with enable. A p-channel pull-up transistor 702 is sized for a larger photo-current than that of both n-channel pull-down transistors 704, 706. An enable input 708 and two programmable inputs 710, 712 control operation of the detector. The absolute and relative sizing of p-channel pull-up transistor 702 and n-channel pull-down transistors 710, 712 defines radiation levels above which the output switches from low to high.

In an alternative embodiment, a detector includes n-channel pull-down transistor and a pair of p-channel pull-up transistors. The n-channel transistor may then be sized for a larger photo-current than that of both p-channel pull-down transistors. An enable input at the n-channel transistor and a programmable input at each p-channel transistor controls operation of the detector and the absolute and relative sizing of the transistors defines radiation levels above which the output switches from high to low.

In another embodiment, resistors coupled between the drains of the programming transistors and the output 714 provide additional control.

Inverters such as 320, 322 may be configured in an n-channel/p-channel totem pole configuration with a drain of each transistor coupled with an inverter output, a source of the n-channel transistor coupled with VSS and a source of the p-channel transistor coupled with VDD. The gate of both transistors may be coupled with the inverter input. In this configuration, the transistors are sized for balanced pull-up and pull-down drive strengths or an active output high/low drive strength ratio of 1. For CMOS, this may require the p-channel pull-up transistors to be about twice the size of n-channel pull-down transistors. During a radiation event, more radiation photo-current may be generated in the larger p-channel pull-up transistor than in the smaller n-channel pull-down transistors. As a result, only part of the p-channel radiation pull-up photo-current is offset or cancelled by the n-channel radiation pull-down photo-current. The remaining difference radiation pull-up photo-current behaves like a radiation-controlled pull-up current source that tends to pull the output high—thus potentially disrupting the logic state of the gate. Terms such as coupled, connected, and intercoupled are generally intended to refer to an electric connection but are not limited, unless otherwise specified, to a direct connection. I.e., another circuit element may be interposed between two coupled elements.

Figure 8:
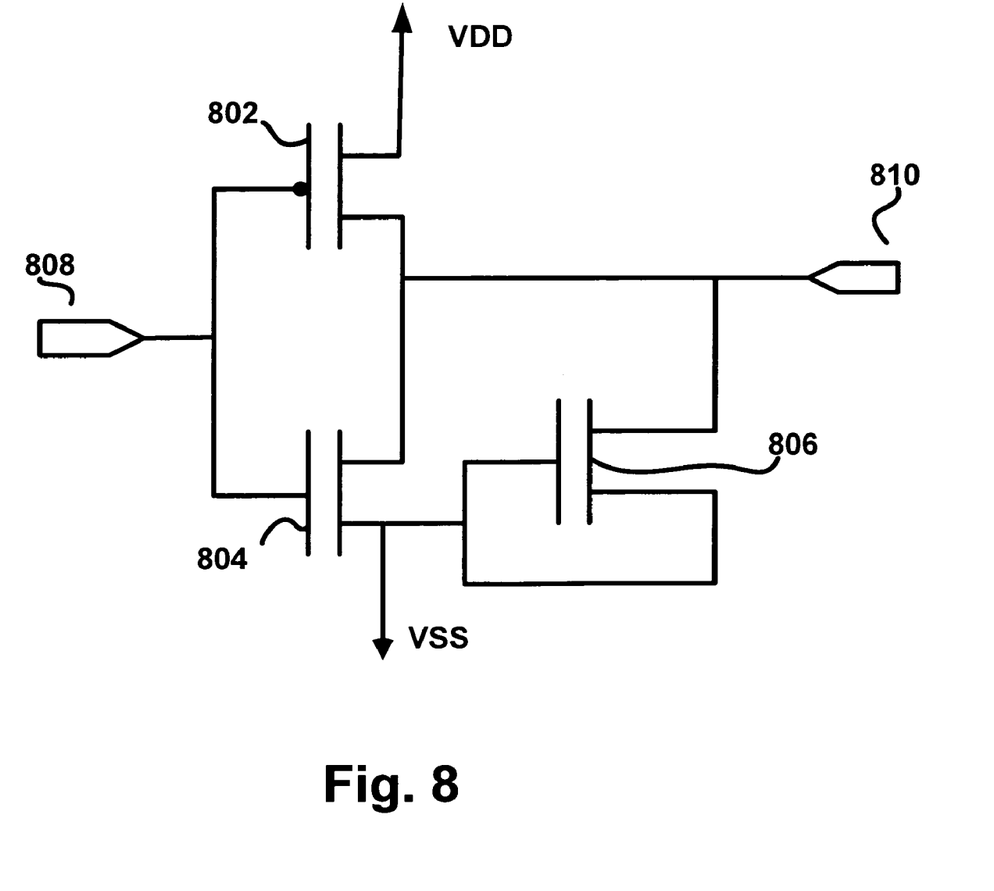
FIG. 8 is a schematic of a radiation hardened CMOS inverting buffer gate.

FIG. 8 provides a radiation hardened CMOS inverting buffer with a passive transistor 806 provided to balance radiation pull-up and pull-down photo-currents in the active transistors 802 & 804.

A first p-channel transistor 802 and a first n-channel transistor 804 each have a drain coupled to an output 810 and a gate coupled to an input 808. A source of the p-channel transistor 802 is coupled to VDD while a source of the first n-channel transistor 804 is coupled to VSS. A second n-channel transistor 806 (passive transistor) has a source and gate coupled to VSS and a drain coupled to the output 810. The second n-channel transistor 806 is sized so that the radiation pull-up photo-current in the p-channel pull-up transistor 802 balances the combined radiation pull-down photo-currents of the two n-channel pull-down transistors 804, 806. Likewise, the gate-current of the first n-channel transistor 804 should be sized to balance the gate current of the p-channel transistor 802. The additional passive transistor 806 requires an additional gate area (lower gate density), added capacitance (lower speed) and higher overall VDD-VSS radiation photo-currents. However, these trade-offs are an acceptable price for an increased radiation immunity.

The radiation hardening design method may be applied in a similar fashion to other logic gate types and other technologies to increase radiation immunity and thereby increase radiation upset levels.

Figure 9:
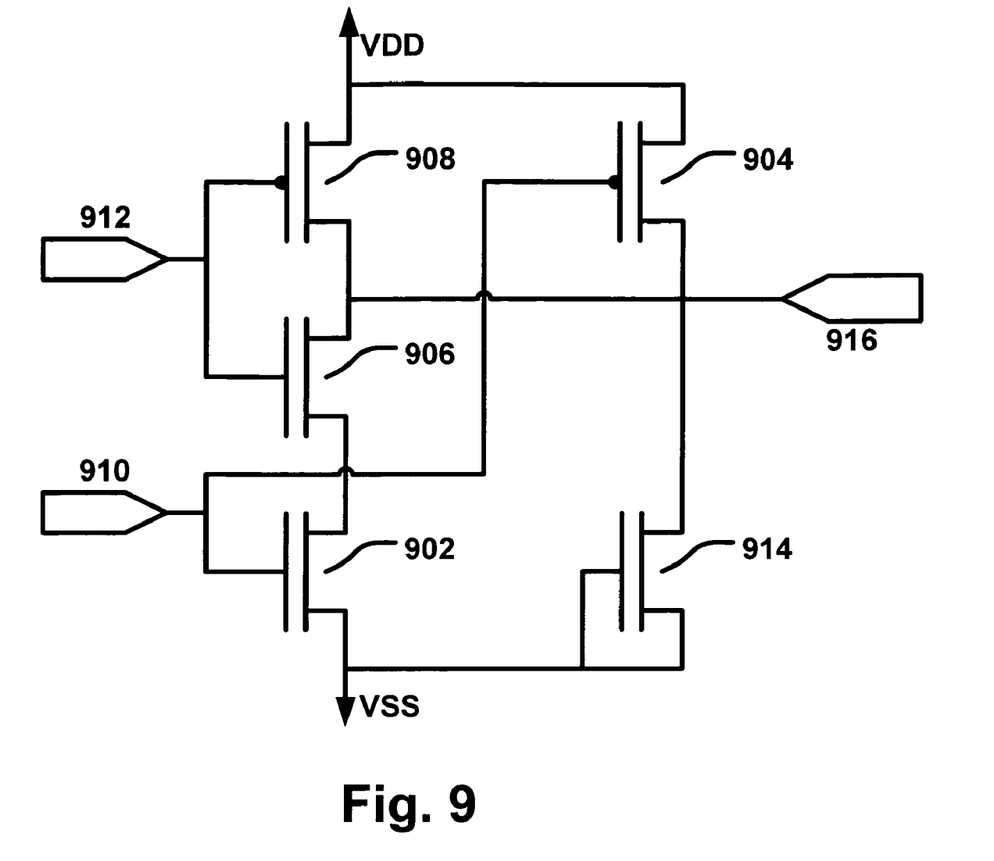
FIG. 9 is a schematic of a radiation hardened CMOS NAND gate.

FIG. 9, for instance, provides a radiation hardened CMOS NAND gate having the gates of two transistors 902, 904 coupled to a first input 910 and the gates of two other transistors 906, 908 coupled to a second input 912. A passive n-channel transistor 914 has a gate and source coupled to VSS and a drain coupled to the output 916. In a radiative environment, a radiation photo-current generated by the passive n-channel transistor 914 may be used to offset the net radiation photo-current generated by the active transistors 902, 904, 906 & 908 at output 916.

Many of the above radiation design methods rely on radiation dose rate photo-current matching to increase circuit immunity to radiation dose rate. In general, if the sum of the radiation dose rate photo-currents into a circuit node are equal to the sum of the radiation dose rate photo-currents out of that node (i.e. a net radiation dose rate photo-current of zero), then these radiation dose rate photo-currents will have no effect on circuit function at that node. The local bypass capacitance and power supply must be able to supply the additional current necessary to compensate for these additional node cancellation photo-currents.

The designs presented may also provide circuitry for offsetting/canceling the effects of radiation dose rate induced photo-currents on reference and write current magnitudes below the DRU level and an active means of inhibiting write currents between the DRU and DRS levels.

I claim:

1. A radiation write protection circuit comprising:
   a write line trace arranged such that a current passing through the write line trace creates a magnetic field acting on a plurality of MRAM bits;
   a write control circuitry configured to regulate the current passing through the write line trace, the control circuitry comprising:
   (a) a second transistor, wherein a gate and source of the second transistor are coupled to the drain of a first transistor such that a radiation photo-current in the first transistor is substantially offset by a radiation photo-current of the second transistor;
   (b) a radiation hardened write switch apparatus coupled to the write line trace; and
   (c) a radiation detector for inhibiting write activity when a radiation level is above a predetermined level.

2. The radiation write protection circuit of claim 1 further comprising:
   a third transistor, wherein a gate of the third transistor is coupled to a drain of the third transistor and further coupled to the gate of the first transistor and wherein a source of the third transistor is coupled to the ground rail;
   a fourth transistor, wherein a gate and source of the fourth transistor is coupled to the drain of the third transistor such that a radiation photo-current in the third transistor is substantially offset by a radiation photo-current of the forth transistor; and
   a resistive element, wherein the resistive element is intercoupled between the gate and drain of the third transistor and a power rail.

3. The radiation write protection circuit of claim 1 wherein the first transistor is an n-channel transistor and wherein the second transistor is the substantially identical to the first transistor.

4. The radiation write protection circuit of claim 1 wherein the second transistor is substantially the same size as and co-located with the first transistor.

5. The radiation write protection circuit of claim 1 wherein the radiation hardened write switch comprises:
   a fifth transistor having a gate coupled to a write select input and wherein a drain of the fifth transistor is coupled to the write line trace and a source of the fifth transistor is coupled to a power rail; and
   a sixth transistor, wherein the sixth transistor is coupled to the fifth transistor such that a radiation photo-current of the fifth transistor is substantially offset by a radiation photo-current of the sixth transistor.

6. The radiation write protection circuit of claim 1 wherein the radiation hardened write switch comprises a radiation hardened NAND gate.

7. The radiation write protection circuit of claim 6 wherein the NAND gate comprises:
   a plurality of operational transistors forming a NAND logic circuit; and
   an n-channel passive transistor coupled to an output of the NAND gate such that a radiation photo-current of the n-channel transistor substantially offsets a composite radiation photo-current of the NAND gate output.

8. The radiation write protection circuit of claim 6 wherein the radiation hardened write switch further comprises a first inverting buffer gate intercoupled between an output of the NAND gate and the write line trace, the buffer gate being radiation hardened such that radiation photo-current generated by operational transistors is substantially offset by a passive transistor.

9. The radiation write protection circuit of claim 8 wherein the first inverting buffer gate comprises:
   a write select input;
   a first n-channel transistor, wherein the first n-channel transistor has a gate coupled to the write select input, a drain coupled with an inverter output, and source coupled with a ground rail;
   a first p-channel transistor, wherein the first p-channel transistor has a gate coupled to the write select input, a drain coupled with the inverter output, and a source coupled with a power rail;
   a second n-channel transistor, wherein the second n-channel transistor has a gate and source coupled to a ground rail and wherein the second n-channel transistor has a drain coupled with the inverter output;
   wherein the second n-channel transistor is sized so that a radiation pull-up photo-current in the p-channel transistor balances a combined pull-down photocurrent in the two n-channel transistors.

10. The radiation write protection circuit of claim 9 further comprising a second inverting buffer intercoupled between the output of the NAND gate and a drain of the second transistor, wherein the operational n-channel and p-channel transistors in the first inverting buffer are sized to provide sufficient write gate-current while operational elements of the second inverting buffer are sized to provide sufficient current for the radiation photo-current in the second transistor.

11. Radiation hardened circuitry comprising:
   a circuit node separate from both a power rail and a ground rail;
   one or more active transistors coupled to the circuit node;
   one or more passive transistors coupled to the circuit node, wherein each passive transistor is made passive by coupling a gate of the passive transistor to one of a source of the passive transistor or a gate of the passive transistor, and wherein the one or more passive transistors are configured to substantially offset a net radiation photo-current of the active transistors coupled to the circuit node.

12. The radiation hardened circuitry of claim 11, wherein each passive transistor is paired with one of the one or more active transistors, wherein each passive transistor is substantially the same type as its corresponding active transistor.

13. The radiation hardened circuitry of claim 11, wherein each passive transistor is paired with one of the one or more active transistors, wherein each passive transistor is substantially co-located with and substantially the same size as its corresponding active transistor.

14. The radiation hardened circuitry of claim 11 wherein the one or more active transistors are part of a radiation hardened radiation detector further comprising:
   an output of the radiation hardened radiation detector to a first circuit, wherein the radiation hardened radiation detector is configured to disable functionality at the first circuit when a radiation level is above a predetermined level.

15. The radiation hardened circuitry of claim 11, further comprising:
   a reference circuit coupled between a power rail and a ground rail, the reference circuit including:
      (a) an active reference transistor having a source coupled to the ground rail and both a gate and drain coupled to a second end of a reference resistor, the active reference transistor being one of the one or more active reference transistors;
      (b) a reference resistor having a first end coupled to the power rail and the second end coupled to the gate and drain of the active reference transistor;
      (c) a passive reference radiation transistor having a drain coupled to a power rail and both a gate and a source coupled to the gate and drain of the active reference transistor to generate a first pull-up radiation photo-current to substantially offset a first pull-down radiation photocurrent of the active reference transistor, the passive reference radiation transistor being one of the one or more passive transistors; and
   a switched mirror drive circuit coupled between the power rail and ground rail, the switched mirror drive circuit including:
      (a) a write line trace;
      (b) an active current mirror transistor having a source coupled to the ground rail, a gate coupled to a drain of the active reference transistor and a drain coupled to a second end of the write line trace, the active current mirror transistor being one of the one or more active transistors;
      (c) an active write select transistor having a drain coupled to a first end of the write line trace, a source coupled to the power rail, and a gate coupled to a write select input, the active write select transistor being one of the one or more active transistors, and wherein when both the active current mirror transistor and the active write select transistor are active, a current passes through the write line trace;
      (d) a passive current mirror radiation transistor arranged to generate a second pull-up radiation photo-current to substantially offset a pulldown radiation photo-current of the active current mirror transistor, the passive current mirror radiation transistor being one of the one or more passive transistors; and
      (e) a passive write select radiation transistor arranged to generate a third pull-down radiation photo-current to substantially offset a pull-up radiation photo current of the active write select transistor, the passive write select radiation transistor being one of the one or more passive transistors.

16. The radiation hardened circuitry of claim 15, further comprising a write select line coupled with a gate of the write select transistor for switching the mirror circuit to a write mode.

17. The radiation hardened circuitry of claim 15, wherein the write line trace is associated with an array of MRAM bits such that a current passing through the write line trace applies a magnetic field on a plurality of the MRAM bits.

18. A radiation hardened circuit comprising at least a first active transistor connected to a first passive transistor at a first node, the first passive transistor configured to (i) provide no current at the first node in the absence of radiation and (ii) provide a radiation photo-current to substantially counterbalance an active transistor induced radiation photo-current at the first node in the presence of radiation.

19. The radiation hardened circuit of claim 18, wherein the first passive transistor is tied-off such that a source of the first passive transistor is coupled with a gate of the passive transistor.

20. The radiation hardened circuit of claim 18, wherein the passive transistor is an n-type transistor sized such that the first passive transistor induced photo-current substantially counterbalances the active transistor induced radiation photo-current at the first node.

21. A method of radiation hardening comprising:
   coupling a passive transistor between a circuit node and a power rail to substantially offset a net radiation photo-current of one or more active transistors connected to that circuit node.

22. The method of radiation hardening of claim 21, wherein the one or more active transistors are part of a radiation hardened radiation detector, and the method further comprising:

coupling an output of the radiation hardened radiation detector to a first circuit, wherein the radiation hardened radiation detector is configured to disable functionality at the first circuit when a radiation level is above a predetermined level.

* * * * *

UNITED STATES PATENT AND TRADEMARK OFFICE
CERTIFICATE OF CORRECTION

PATENT NO.       : 7,613,058 B2
APPLICATION NO.  : 11/240882
DATED            : November 3, 2009
INVENTOR(S)      : Lance L. Sundstrom It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 946 days.

Signed and Sealed this

Nineteenth Day of October, 2010

David J. Kappos
*Director of the United States Patent and Trademark Office*